US012575126B2

(12) United States Patent
Baringhaus et al.

(10) Patent No.: US 12,575,126 B2
(45) Date of Patent: Mar. 10, 2026

(54) MOSFET WITH SATURATION CONTACT AND METHOD FOR FORMING A MOSFET WITH SATURATION CONTACT

(71) Applicant: Robert Bosch GmbH, Stuttgart (DE)

(72) Inventors: Jens Baringhaus, Sindelfingen (DE); Daniel Krebs, Aufhausen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 567 days.

(21) Appl. No.: 17/783,129

(22) PCT Filed: Feb. 15, 2021

(86) PCT No.: PCT/EP2021/053595
§ 371 (c)(1),
(2) Date: Jun. 7, 2022

(87) PCT Pub. No.: WO2021/165182
PCT Pub. Date: Aug. 26, 2021

(65) Prior Publication Data
US 2023/0019288 A1 Jan. 19, 2023

(30) Foreign Application Priority Data
Feb. 19, 2020 (DE) ..................... 10 2020 202 053.1

(51) Int. Cl.
*H01L 21/78* (2006.01)
*H10D 12/01* (2025.01)
(Continued)

(52) U.S. Cl.
CPC ......... *H10D 30/477* (2025.01); *H10D 12/031* (2025.01); *H10D 30/015* (2025.01);
(Continued)

(58) Field of Classification Search
CPC ............. H01L 29/7788; H01L 29/1606; H01L 29/1608; H01L 29/2003; H01L 29/45;
(Continued)

(56) References Cited

U.S. PATENT DOCUMENTS 5,270,798 A * 12/1993 Pao ..................... H01L 29/7787
257/E29.253
6,504,235 B2 * 1/2003 Schmitz .............. H01L 23/3171
257/649
(Continued)

FOREIGN PATENT DOCUMENTS

DE 102018218704 A1 4/2020
JP S62130565 A 6/1987
(Continued)

OTHER PUBLICATIONS

International Search Report for PCT/EP2021/053595, Issued Apr. 29, 2021.

*Primary Examiner* — Vu A Vu
(74) *Attorney, Agent, or Firm* — NORTON ROSE FULBRIGHT US LLP

(57) ABSTRACT

A MOSFET with saturation contact. The MOSFET with saturation contact includes an n-doped source region, a source contact, a contact structure, which extends from the source contact to the n-doped source region, and forms with the source contact a first conductive connection and forms with the n-doped source region a second conductive connection, a barrier layer and an insulating layer. The contact structure includes a section between the first conductive connection and the second conductive connection, which is embedded between the barrier layer and the dielectric layer and is configured in such a way that a two-dimensional electron gas is formed therein.

12 Claims, 8 Drawing Sheets

(51) Int. Cl.

| | |
|---|---|
| *H10D 30/01* | (2025.01) |
| *H10D 30/47* | (2025.01) |
| *H10D 62/80* | (2025.01) |
| *H10D 62/832* | (2025.01) |
| *H10D 62/85* | (2025.01) |
| *H10D 64/62* | (2025.01) |

(52) U.S. Cl.
CPC ..... *H10D 62/8325* (2025.01); *H10D 62/8503* (2025.01); *H10D 62/882* (2025.01); *H10D 64/62* (2025.01)

(58) Field of Classification Search
CPC ......... H01L 29/66068; H01L 29/66462; H01L 29/41741; H01L 29/66734; H01L 29/7813; H01L 29/7803
USPC ........................................................... 257/77
See application file for complete search history.

(56) References Cited

U.S. PATENT DOCUMENTS

| | | | | |
|---|---|---|---|---|
| 7,038,252 | B2 * | 5/2006 | Saito | H01L 29/7786 257/E29.252 |
| 7,432,142 | B2 * | 10/2008 | Saxler | H01L 29/7787 257/E21.406 |
| 7,812,371 | B2 * | 10/2010 | Kaya | H01L 29/7787 257/190 |
| 7,985,986 | B2 * | 7/2011 | Heikman | H01L 29/7787 257/E29.246 |
| 8,933,489 | B2 * | 1/2015 | Kikkawa | H01L 29/205 257/E21.403 |
| 8,936,976 | B2 * | 1/2015 | Radosavljevic | H01L 29/20 438/371 |
| 9,111,905 | B2 * | 8/2015 | Yao | H01L 21/02546 |
| 9,306,050 | B2 * | 4/2016 | Shealy | H01L 21/02145 |
| 9,455,342 | B2 * | 9/2016 | Lu | H01L 29/405 |
| 9,660,064 | B2 * | 5/2017 | Dasgupta | H01L 21/30612 |
| 10,964,733 | B2 * | 3/2021 | Moens | H01L 31/022416 |
| 2015/0108564 | A1 | 4/2015 | Miura et al. | |
| 2017/0229535 | A1 | 8/2017 | Hatta et al. | |
| 2018/0261673 | A1 | 9/2018 | Tanaka et al. | |
| 2020/0044083 | A1 | 2/2020 | Tang et al. | |

FOREIGN PATENT DOCUMENTS

| | | |
|---|---|---|
| JP | 2012190982 A | 10/2012 |
| JP | 2015153789 A | 8/2015 |
| WO | 2016002386 A1 | 1/2016 |
| WO | 2017176287 A1 | 10/2017 |

* cited by examiner

600

610 — form n-doped source region

620 — form barrier layer

630 — form contact structure

640 — form dielectric layer

MOSFET WITH SATURATION CONTACT AND METHOD FOR FORMING A MOSFET WITH SATURATION CONTACT

FIELD

The present invention relates to a MOSFET with saturation contact and to a method for forming a MOSFET with saturation contact.

BACKGROUND INFORMATION

Power MOSFETs including a vertical channel region (TMOSFET) or including a lateral channel region (VD-MOSFET) are typically used for the application of semiconductors that have a wide band gap (for example, silicon carbide (SiC) or gallium nitride (GaN)) in power electronics. With the aid of design parameters of the channel region, it is possible to adjust, in particular, switch-on voltage, resistance in the switch-on state (switch-on resistance $R_{ON}$) and saturation current (short-circuit resistance). The channel region of such a power MOSFET is often also combined with a further doped region, which forms a JFET (JMOSFET), in order to generate a better shield and thus higher breakdown voltages. In the case of SiC, nickel is typically used as a source contact, which is alloyed to form nickel silicide.

In a VDMOSFET, TMOSFET, or JMOSFET according to the related art, a preferably low $R_{ON}$ and a preferably low saturation current may antagonistically oppose one another as optimization goals. A low switch-on resistance $R_{ON}$ generally means that the saturation current is correspondingly high and, as a consequence, the short-circuit resistance is impeded. Accordingly, it may be necessary to find a compromise between sufficiently low $R_{ON}$ and nevertheless also a sufficiently low saturation current.

SUMMARY

In various exemplary embodiments of the present invention, a MOSFET that includes a contact structure (also referred to as saturation contact, because the contact structure exhibits a saturation behavior at high voltages) is provided, which may have a resistance at low voltages that is significantly lower than a resistance in a channel of the MOSFET, and at high voltages may exhibit a resistance that is significantly higher than the channel resistance.

Thus, the two optimization goals may be decoupled from one another, since now the channel may be optimized to achieve a preferably low $R_{ON}$ and the saturation contact may be used to limit the current at high voltages.

In various exemplary embodiments of the present invention, graphene may be used for the contact structure, which contacts the semiconductor material of the MOSFET (for example, SiC), in order to generate such a saturation contact behavior in the contact structure. As a result of the high mobility of the two-dimensional electron gas (2DEG) in the graphene, it is possible to achieve a very minimal resistance at low voltages. Since, however, the drift velocity of the charge carriers (electrons) in the two-dimensional electron gas have a very low saturation voltage, its mobility is drastically reduced above a critical voltage. As a result, the current through the (for example, power) MOSFET may be effectively limited at high voltages by the contact structure resistance.

FIG. 1 shows simulated initial characteristic curves of a (power) MOSFET with a graphene contact structure, which connects the source contact to a channel of the MOSFET (solid line), as compared to a conventional TMOSFET (dashed line) and a pure graphene resistance (dash-dotted line). At low voltages, the current is limited by the resistance of the channel of the MOSFET, whereas at high voltages, the contact resistance determines the current limit.

A "low voltage," "small voltage," or "minimal voltage" is understood herein to mean a voltage, which is in a magnitude range of an operating voltage of the MOSFET, for example, a few volts, for example, up to approximately 10 V. A "high voltage" or "large voltage" is understood to mean a voltage, which is a multiple of the operating voltage, for example, twice as much or more, for example, approximately 20 V or more.

One advantage of a MOSFET with saturation contact is that the antagonistic optimization parameters in the MOSFET without saturation contact, saturation current (and thus short-circuit resistance) and $R_{ON}$, are optimizable or optimized independently of one another. As a result, a low $R_{ON}$ is achievable with a simultaneously high short-circuit resistance (low saturation current).

BRIEF DESCRIPTION OF THE DRAWINGS

Refinements of the aspects of the present invention are set forth in the description herein. Specific embodiments of the present invention are represented in the figures and explained in greater detail in the following description.

DETAILED DESCRIPTION OF EXAMPLE EMBODIMENTS

Figures 2, 3:
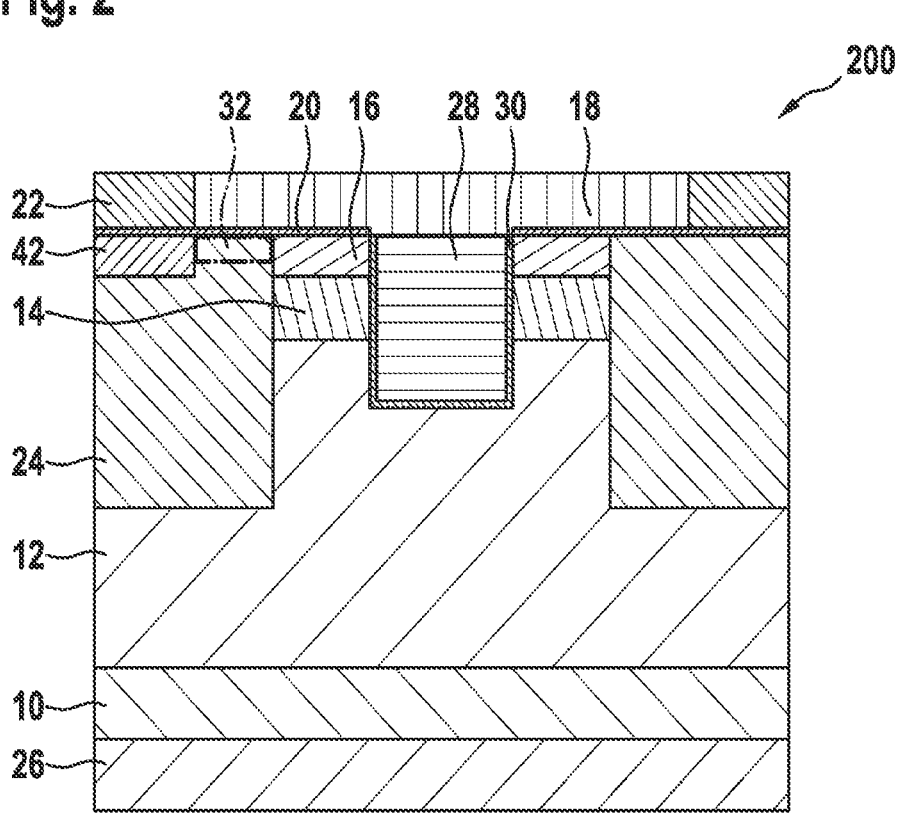
FIG. 2 schematically shows a cross-sectional view of a MOSFET with saturation contact according to different exemplary embodiments of the present invention.
FIG. 3 shows a substitute schematic diagram of a MOSFET with saturation contact according to various exemplary embodiments of the present invention.
Figure 4A:
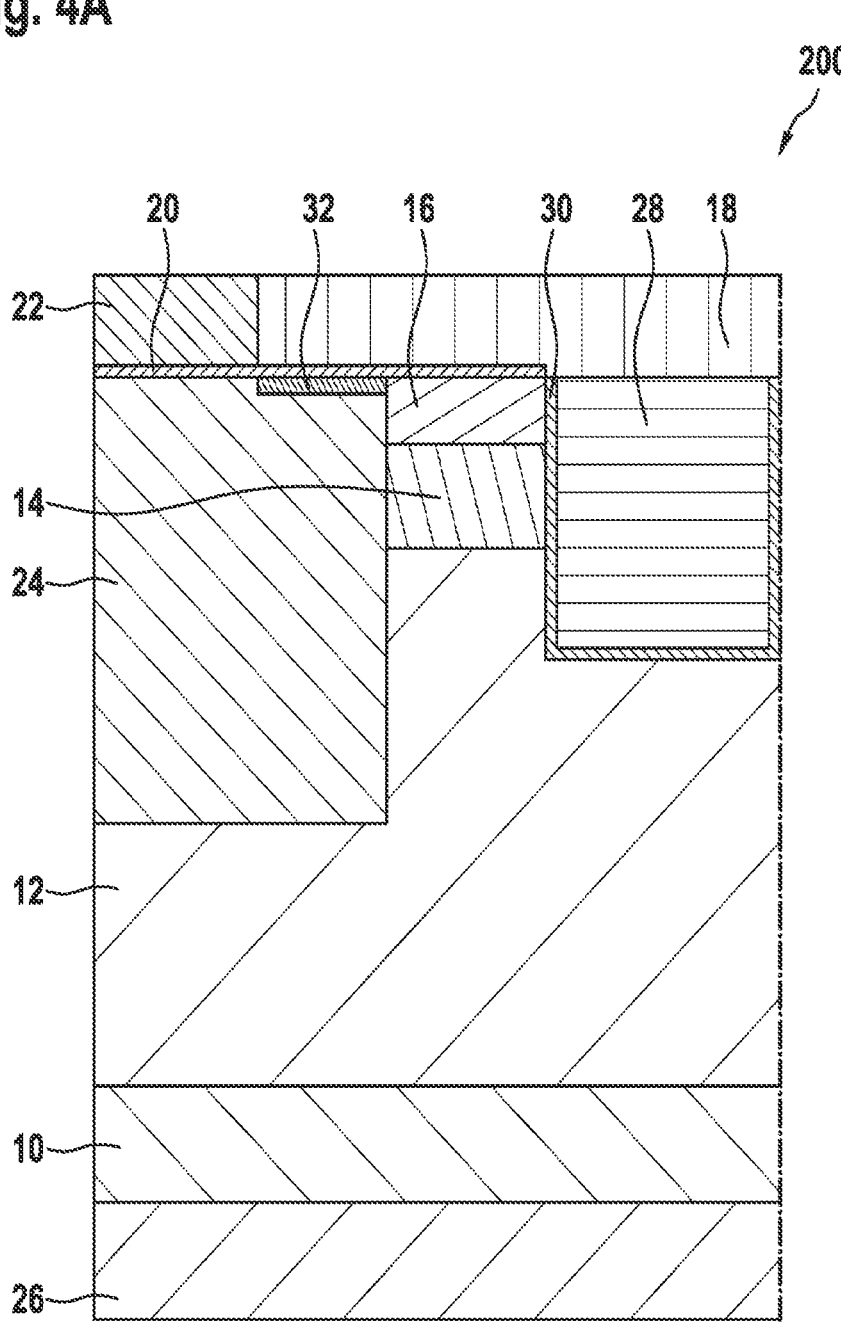
FIGS. 4A and 4B each schematically show a cross-sectional view of a MOSFET with saturation contact according to different exemplary embodiments of the present invention.
Figure 4B:
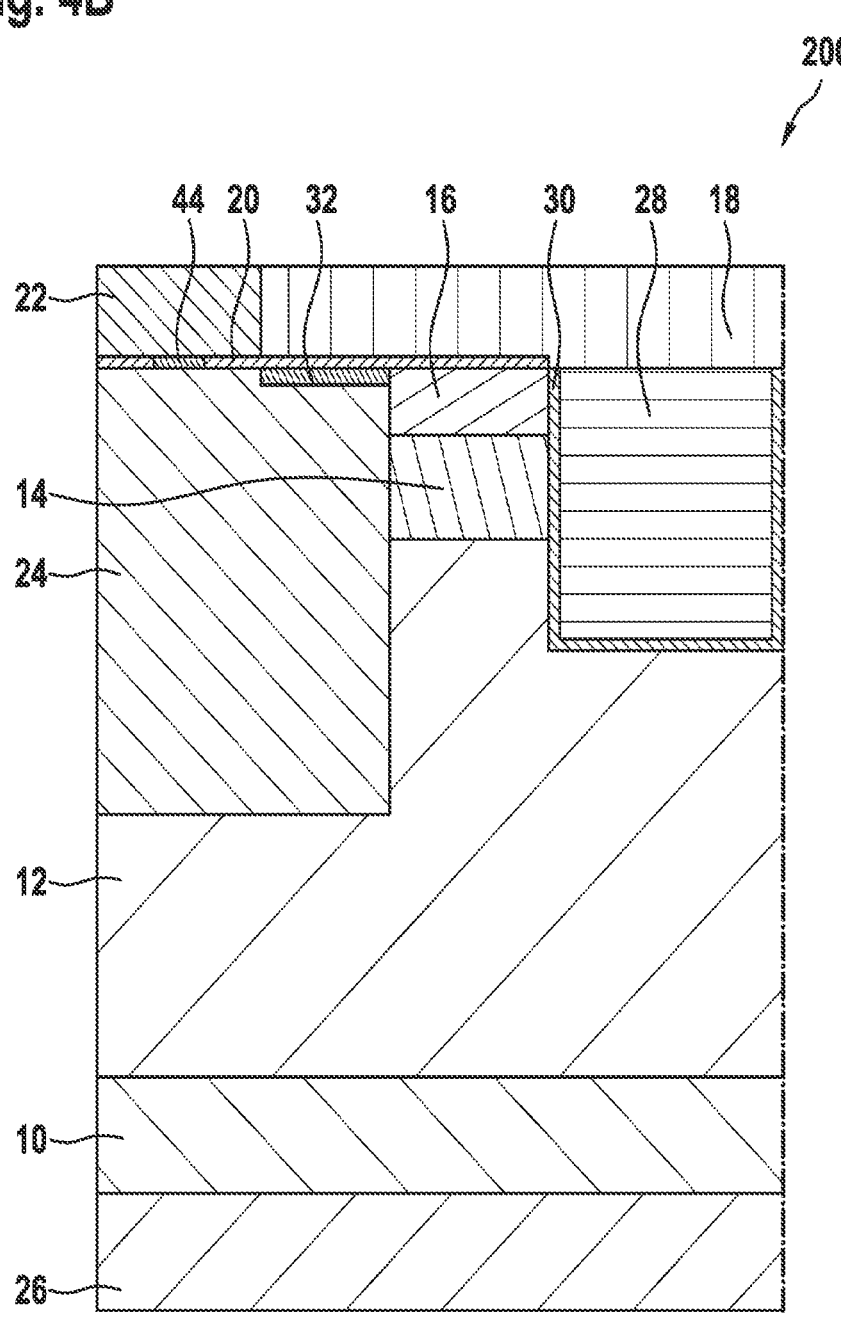

FIG. 2, FIG. 4A and FIG. 4B each schematically show a cross-sectional view of a MOSFET with saturation contact 200 according to different exemplary embodiments. Although a JMOSFET including a vertical channel region is described below by way of illustration, it is understood that exemplary embodiments also relate to MOSFETs including other structures, for example, MOSFETs including a vertical channel region (TMOSFET), which do not form a JMOSFET or, for example, including a lateral channel region (VDMOSFET).

The MOSFET with saturation contact 200 may include an n-doped source region 16, a source contact 22, a contact structure 2, which extends from source contact 16 to n-doped source region 16, and forms with source contact 22 a first conductive connection and forms with the n-doped source region 16 a second conductive connection, a barrier layer 32 and a dielectric layer 18.

The MOSFET with saturation contact 200 may further include further structures, which may be formed in an essentially MOSFET-conventional manner, for example, a p-doped channel region 14, an n-doped drift region 12, a substrate 10, a drain connection 16, a gate region 28 and a gate dielectric 30.

The MOSFET with saturation contact may include, for example, silicon carbide and/or gallium nitride and/or another suitable semiconductor material (for example, for power MOSFETs) as a semiconductor material, which is doped or has been doped in order, for example, to form n-doped source region 16, p-doped channel region 14 and n-doped drift region 12, and/or as a substrate 10.

In different exemplary embodiments, a doping concentration in n-doped source region 16 may be higher than in n-doped drift region 12. For example, source region 16 may be approximately 1E19/cm$^3$ doped, and drift region 12 may be approximately 1E16/cm$^3$ doped. To simplify, the designation n-doped is used below.

Contact structure 20 may have a section between the first conductive connection and the second conductive connection, which is embedded between barrier layer 32 and dielectric layer 18, and is configured in such a way that a two-dimensional electron gas is formed or may be formed therein.

The forming of the two-dimensional electron gas 2DEG may result in the section of contact structure 20 exhibiting a voltage-dependent resistance. For example, the voltage-dependent resistance may be small, for example, smaller than a resistance of the p-doped channel region 14, when an operating voltage of the MOSFET is present (for example, a voltage, which is approximately as high as the operating voltage, for example, between approximately 0 V and approximately 10 V). When a voltage is present, which is higher than the operating voltage (for example, is a multiple or is higher by a multiple), the voltage-dependent resistance may be high, for example, higher than the resistance of p-doped channel region 14.

In different exemplary embodiments, contact structure 20 may include a graphene layer, a layer system, which includes at least one gallium nitride layer and at least one aluminum gallium nitride layer, a molybdenum sulfide layer or another layer or another layer system, which is suitable for forming a two-dimensional electron gas. In this case, the layer or the layer structure may be formed in such a way that, for example, in terms of layer thickness, number and relative position of the individual layers of a layer system, etc., the forming of the 2DEG is made possible. The design parameters to be taken into consideration so that the 2DEG is formable, may be familiar or essentially familiar to those skilled in the art.

Contact structure 20 may extend completely (as shown, for example, in FIGS. 2, 4A, 4B and 5A through 5C) over n-doped source region 16, or (not shown) may cover only an upper surface of n-doped source region 16.

Contact structure 20 may extend completely (as shown, for example, in FIGS. 2, 4A, 4B and 5A through 5C) below source contact 22, may extend, for example, only below a portion of source contact 22 (not shown) and/or, for example, may include openings in its surface (FIG. 4B).

In different exemplary embodiments, the MOSFET with saturation contact 200 may further include a p-doped shielding region 24, which may be situated below contact structure 20 adjacent to n-doped source region 16. In that case, the section of contact structure 20 may be located above p-doped shielding region 24.

In various exemplary embodiments, for example, in a case in which contact structure 20 includes graphene, n-doped source region 16 includes n-doped silicon carbine and p-doped shielding region 24 includes p-doped silicon carbide, the graphene for n-doped silicon carbide may form a low impedance contact. A conductivity of the contact between contact structure 20 and p-doped shielding region 24 may be intrinsically so poor that without further measures, barrier layer 32 is formed in p-doped shielding region 24, for example, in an area adjacent to surface of p-doped shielding region 24. This is shown in FIG. 2. In other words, barrier layer 32 may be part of p-doped shielding region 24.

In one region, in which contact structure 20 (for example, the graphene or, optionally, another material, which forms an intrinsically poor contact with p-doped shielding region 24) is contacted by source contact 22, a metal contact 42 may be formed in different exemplary embodiments between contact structure 20 and the p-doped shielding region, which also forms a good contact (i.e., with lower resistance) with the p-doped SiC. Metal contact 42 may include, for example, nickel, titanium, aluminum or compounds thereof. For example, a nickel contact may be alloyed in, so that a nickel silicide is formed. At the same time, p-doped shielding region 24 may be connected with the aid of metal contact 42.

Figure 1:
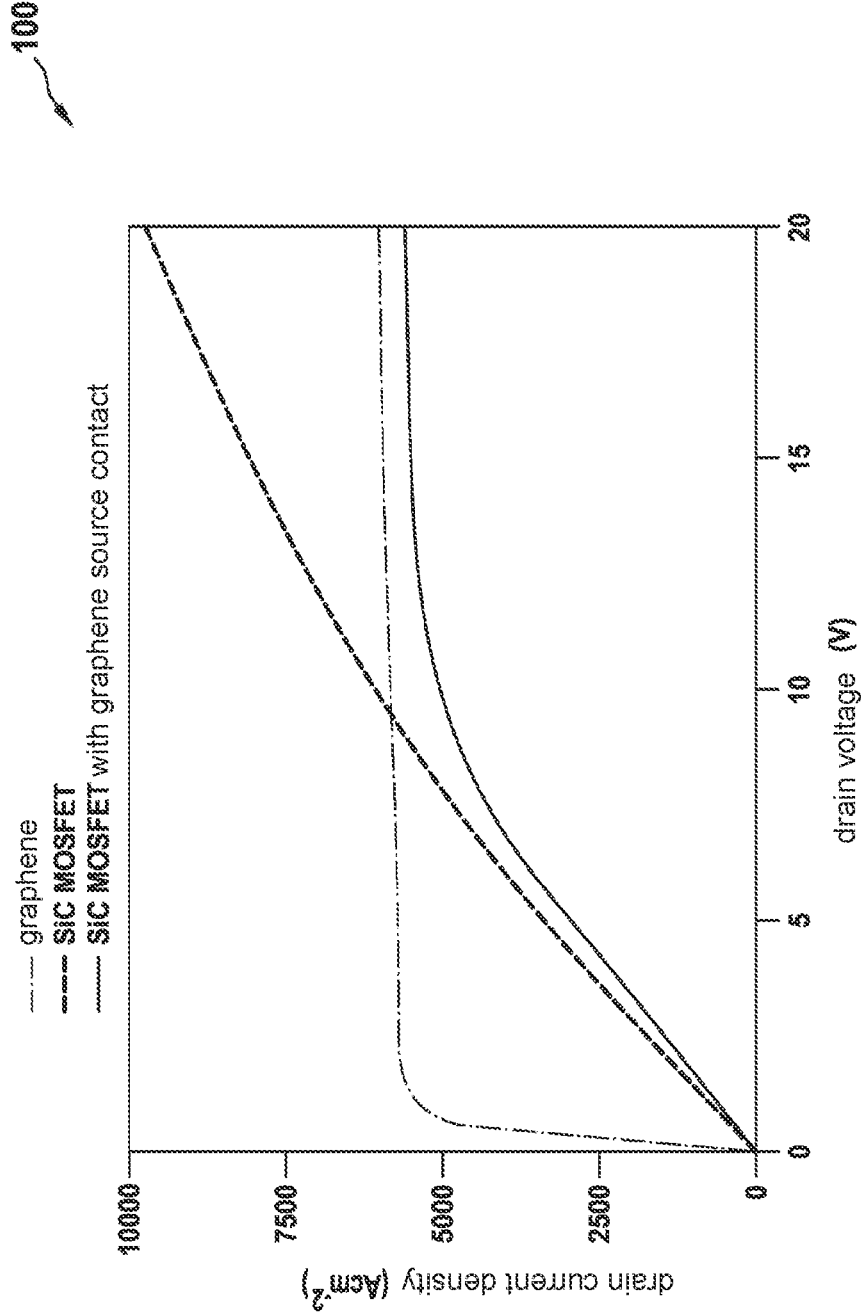
FIG. 1 shows simulated transfer characteristic curves of a MOSFET with a graphene contact structure according to different exemplary embodiments of the present invention as compared to a TMOSFET of the related art and to a pure graphene resistance.

Since the interface between graphene 20 and p-doped shielding region (for example, p-SiC region) 24 forms barrier layer 32, the two-dimensional electron gas forms in graphene layer 20 on p-doped shielding region 24. This electron gas behaves almost like an ideal saturation contact. The mobility of the 2DEG at small voltages is orders of magnitude higher than the mobility in the SiC, so that at low voltages only a negligible resistance to $R_{ON}$ is added. Compare to this also the substitute schematic diagram from FIG. 3. At higher voltages, graphene layer 20 immediately reaches saturation and allows only a constant current density over wide voltage ranges (see FIG. 1). This current density may lie above that of the operating point of the MOSFET, but significantly below its saturation current density.

In a linear area of the starting characteristic curve of MOSFET with saturation contact 200, the current flow is thus not limited by graphene 20; it is, however, limited in the saturation region of the MOSFET with saturation contact 200. As a result, the total current is effectively limited in case of a short-circuit and the short-circuit resistance is thereby improved without adversely affecting the forward characteristics of the MOSFET with saturation contact 200.

In other words, the MOSFET exhibits a strong voltage-dependent resistance between source region 16/contact structure 20-contact point and source contact 22/contact structure 20-contact point as "saturation contact." At low voltages, the resistance is ideally infinitesimally small, at high voltages the resistance is significantly greater than the channel resistance (i.e., the resistance in p-doped channel region 14) or than the resistance of drift region 12 of the MOSFET.

In different exemplary embodiments, for example, in a case in which contact structure 20 includes a material or a material combination, which is able to form a solid conductive contact both with n-doped source region 16 as well as with p-doped shielding region 24, barrier layer 32 may be formed as separate barrier layer 32, for example, as an oxide layer or nitride layer. This is shown, for example, in FIGS. 4A and 4B.

Barrier layer 32 may, to the extent that, in contrast to that shown in FIGS. 4A and 4B, it extends to below source contact 22, optionally be open at individual points (for example, at regular intervals perpendicular to the drawing plane, i.e., for example, along a trench, in which the gate in a TMOSFET is formed), in order to also contact p-doped shielding region 24.

Figure 5A:
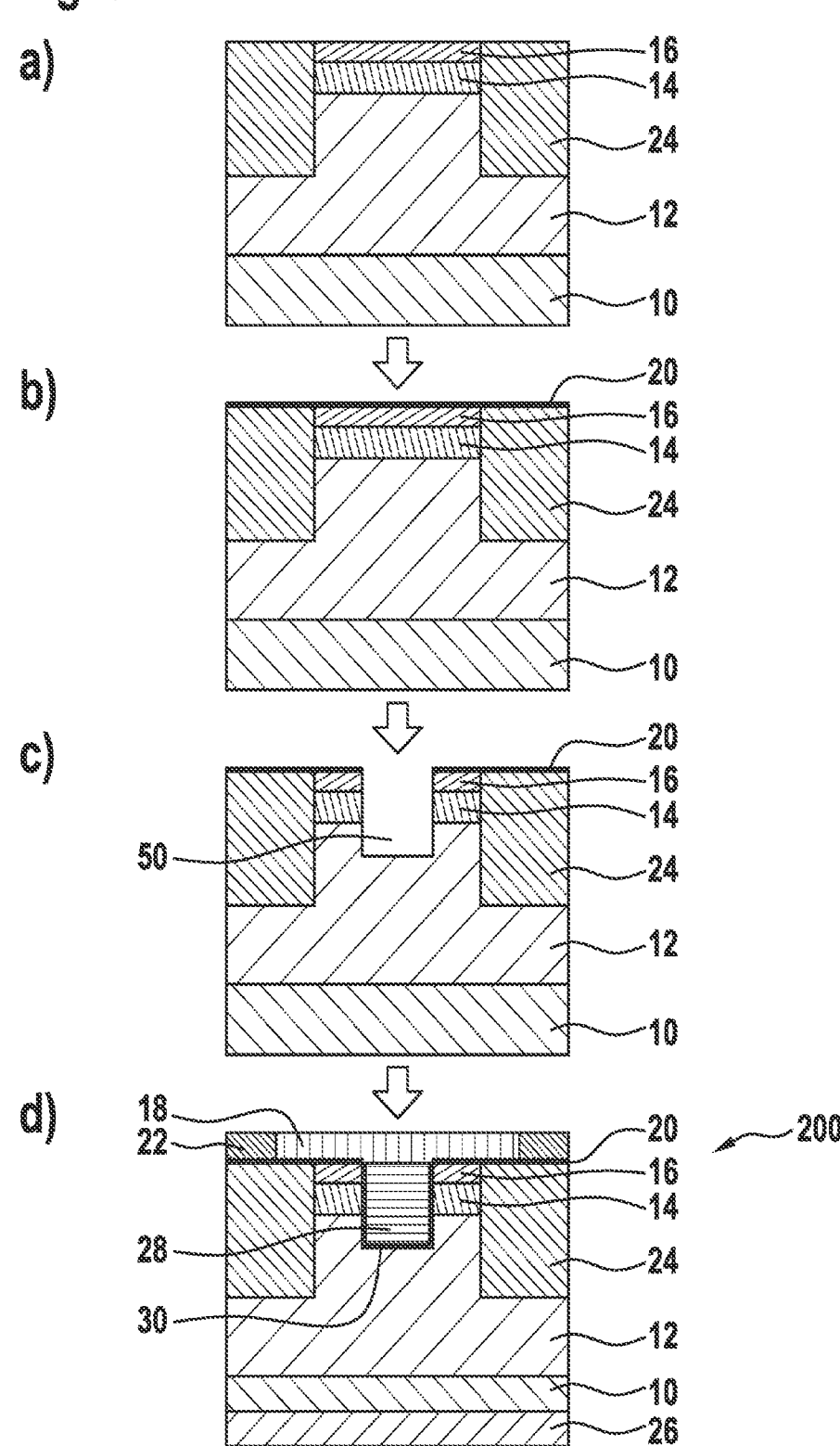
FIGS. 5A, 5B, and 5C each schematically show an illustration of a method for forming a MOSFET with saturation contact according to different exemplary embodiments of the present invention.
Figure 5B:
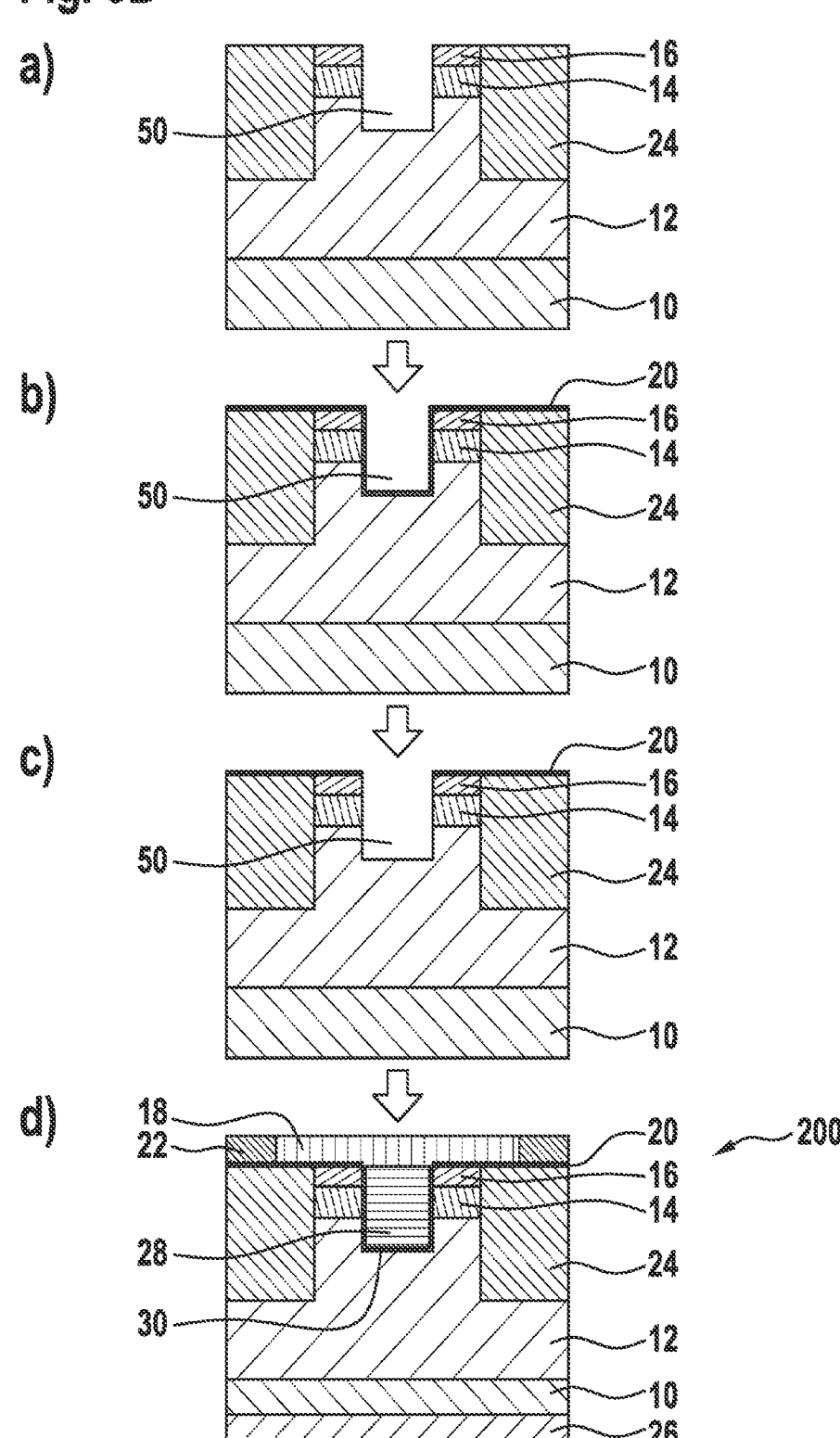
Figure 5C:
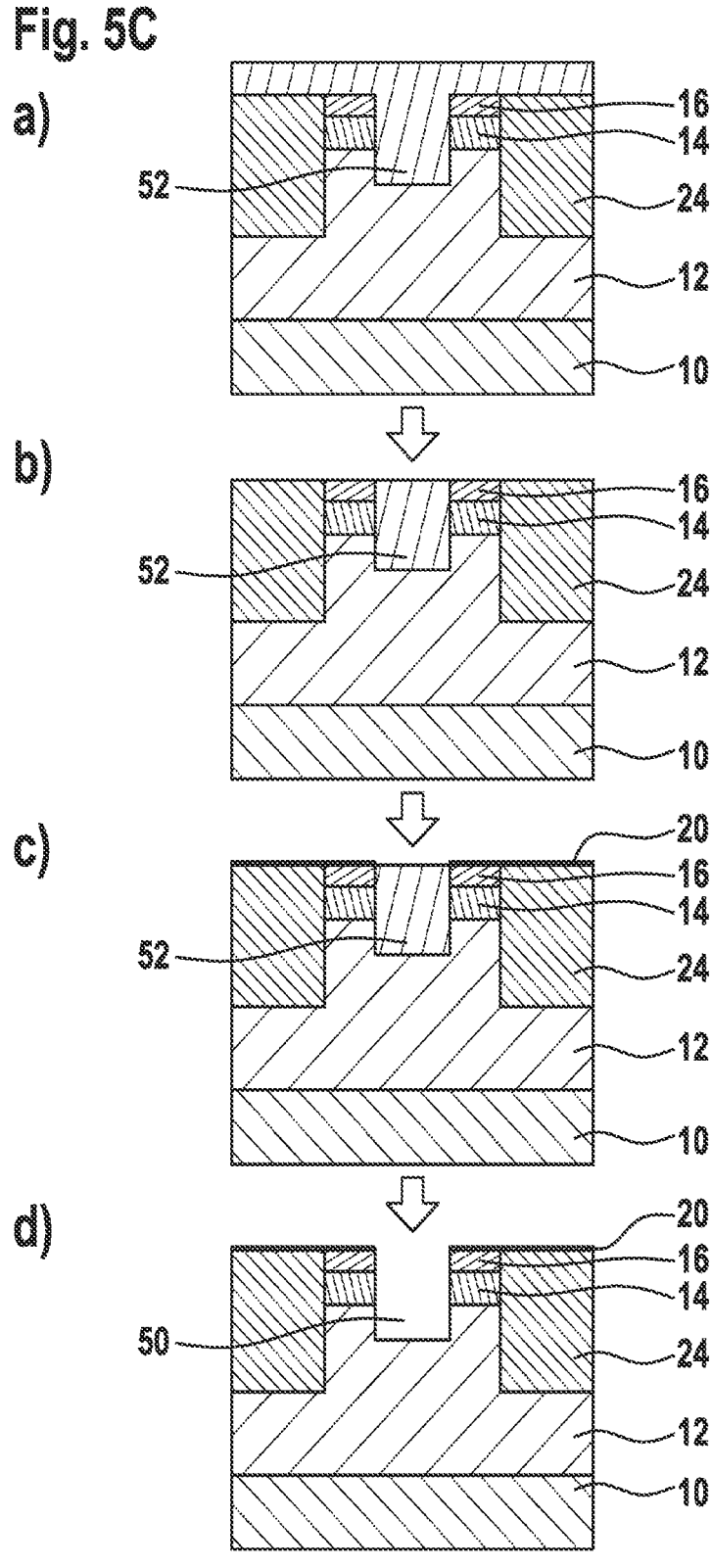

FIGS. 5A, 5B and 5C each schematically show an illustration of a method for forming a MOSFET with saturation contact 200 according to different exemplary embodiments.

FIG. 5A illustrates a forming of a TMOSFET with saturation contact 200 with graphene saturation contact 20. After implantation, for example, of p-doped channel region 14, of n-doped source region 16 and p-doped shielding region 24, and after an implant activation (representation a), graphene may be grown at approximately 1700° C., for example, over the entire surface (representation b). A channel (trench) 50 may be subsequently formed and post-treated (for example, chamfered) (at approximately 1400° C.; representation c). All further processes such as, for example, deposition of a gate dielectric 30, for example, of a gate oxide, annealing, deposition of polysilicon as gate electrode 28, etc., may also be subsequently carried out (representation d) and may be limited to temperatures of a maximum of 1400° C.

Alternatively, as shown in FIG. 5B, trench 50 may be formed first and post-treated (for example, chamfered) (representation a), and the growing of graphene 20 may take place thereafter (representation b). In that case, graphene 20 in trench 50 must be locally removed again in a subsequent process (representation c). The further processes may be carried out as explained in the case of FIG. 5A (representation d).

In one further variant, which is illustrated in FIG. 5C, trench 50 is filled with a carbon cover 52, a so-called "carbon capping," after its formation and post-treatment (representation a). Carbon cover 52 may be subsequently back-etched, so that it remains only in trench 50 (representation b). Graphene 20 is subsequently grown. Trench 50, which is filled with carbon cover 52, remains free of graphene 20 in this case (representation c). Finally, carbon cover 52 is removed by plasma etching. In this case, it must be ensured that the etching used removes only carbon cover 52, but leaves graphene 20 intact. An oxygen plasma, for example, may be used for this purpose (representation d).

Figure 6:
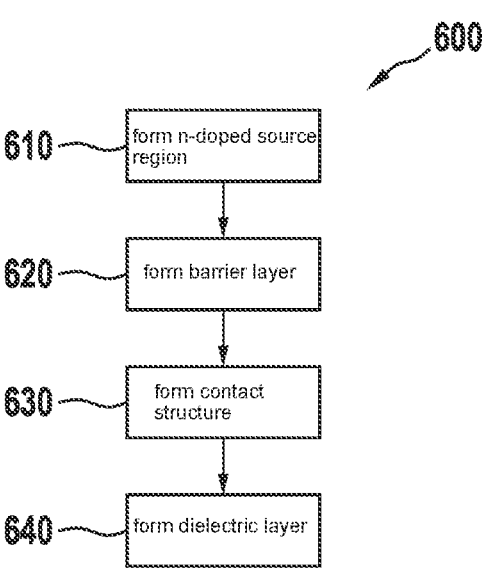
FIG. 6 shows a flowchart of a method for forming a MOSFET with saturation contact according to different exemplary embodiments of the present invention.

FIG. 6 shows a flowchart of a method 600 for forming a MOSFET with saturation contact according to different exemplary embodiments. The method may include a forming of an n-doped source region (at 610), a forming of a barrier layer (at 620), a forming of a contact structure in electro-conductive contact with the n-doped source region, which extends laterally at least over a portion of the n-doped source region and over a portion of the barrier layer (at 630), and a forming of a dielectric layer over a section of the contact structure, which is situated over the barrier layer, the contact structure in the section being configured in such a way that a two-dimensional electron gas is formed therein (at 640).

What is claimed is:

1. A MOSFET, comprising:
an n-doped source region;
a source contact;
a contact structure, which extends from the source contact to the n-doped source region, forms with the source contact a first conductive connection, and forms with the n-doped source region a second conductive connection;
a barrier layer; and an insulating layer;
wherein the contact structure includes a section between the first conductive connection and the second conductive connection, which is embedded between the barrier layer and the dielectric layer and is configured in such a way that a two-dimensional electron gas forms therein,
wherein the section has a voltage-dependent resistance, the voltage-dependent resistance being smaller than a sum of all other resistances of the MOSFET when an operating voltage of the MOSFET is present, and the voltage-dependent resistance being higher than at least one resistance component of the MOSFET when a voltage is present which is higher than a multiple of the operating voltage.

2. The MOSFET as recited in claim 1, wherein the contact structure includes one of a group of configurations, the group including:
a graphene layer;
a layer system, which includes at least one gallium nitride layer and at least one aluminum gallium nitride layer; and
a molybdenum sulfide layer.

3. The MOSFET as recited in claim 1, wherein the n-doped source region includes silicon carbide and/or gallium nitride.

4. The MOSFET as recited in claim 1, further comprising:
a channel sector, the channel sector being laterally or vertically formed.

5. A MOSFET, comprising:
an n-doped source region;
a source contact;
a contact structure, which extends from the source contact to the n-doped source region, forms with the source contact a first conductive connection, and forms with the n-doped source region a second conductive connection;
a barrier layer; and
an insulting layer;
wherein the contact structure includes a section between the first conductive connection and the second conductive connection, which is embedded between the barrier layer and a dielectric layer and is configured in such a way that a two-dimensional electron gas forms therein,
wherein the section has a voltage-dependent resistance, the voltage-dependent resistance being smaller than a sum of all other resistances of the MOSFET when an operating voltage of the MOSFET is present, and the voltage-dependent resistance being higher than at least one resistance component of the MOSFET when a voltage is present which is higher than the operating voltage.

6. A MOSFET, comprising:
an n-doped source region;
a source contact;
a contact structure, which extends from the source contact to the n-doped source region, forms with the source contact a first conductive connection, and forms with the n-doped source region a second conductive connection;
a barrier layer;
an insulting layer; and
a p-doped shielding region, which is situated below the contact structure adjacent to the n-doped region, the barrier layer being part of the p-doped shielding layer,
wherein the contact structure includes a section between the first conductive connection and the second conductive connection, which is embedded between the barrier layer and a dielectric layer and is configured in such a way that a two-dimensional electron gas forms therein.

7. The MOSFET as recited in claim 6, further comprising:

a metal contact, which connects the source contact and the p-doped shielding region in at least a partially electro-conductive manner.

8. The MOSFET as recited in claim 7, wherein the metal contact including nickel, or titanium, or aluminum or compounds of nickel, or titanium, or aluminum.

9. A MOSFET, comprising:

an n-doped source region;

a source contact;

a contact structure, which extends from the source contact to the n-doped source region, forms with the source contact a first conductive connection, and forms with the n-doped source region a second conductive connection;

a barrier layer;

an insulting layer;

wherein the contact structure includes a section between the first conductive connection and the second conductive connection, which is embedded between the barrier layer and a dielectric layer and is configured in such a way that a two-dimensional electron gas forms therein, wherein the barrier layer includes the dielectric layer.

10. The MOSFET as recited in claim 9, wherein the dielectric includes an oxide or a nitride.

11. The MOSFET as recited in claim 9, further comprising:

a p-doped shielding region, which is situated below the barrier layer adjacent to the n-doped source region, the barrier layer including at least one opening, through which the source contact and the p-doped shielding region are electro-conductively connected.

12. A method for forming a MOSFET, comprising the following steps:

forming an n-doped source region;

forming a barrier layer;

forming a contact structure in electro-conductive contact with the n-doped source region, which extends laterally at least over a portion of the n-doped source region and over a portion of the barrier layer;

forming a dielectric layer over a section of the contact structure, which is situated above the barrier layer;

wherein the contact structure in the section being configured in such a way that a two-dimensional electron gas is formed therein, wherein the section has a voltage-dependent resistance, the voltage-dependent resistance being smaller than a sum of all other resistances of the MOSFET when an operating voltage of the MOSFET is present, and the voltage-dependent resistance being higher than at least one resistance component of the MOSFET when a voltage is present which is higher than a multiple of the operating voltage.

* * * * *